United States Patent [19]

Lambert et al.

[11] Patent Number: 5,273,959

[45] Date of Patent: Dec. 28, 1993

[54] ALLOY FOR HTSC COMPOSITE CONDUCTORS MADE OF AU-AG-PD

[75] Inventors: Paul Lambert, Ste-Julie; Claude Gélinas; Blaise Champagne, both of Boucherville; Julian Cave, Westmount, all of Canada

[73] Assignee: National Research Council of Canada, Ottawa, Canada

[21] Appl. No.: 971,239

[22] Filed: Nov. 4, 1992

[51] Int. Cl.$^5$ .............................. B32B 9/00
[52] U.S. Cl. ........................ 505/1; 505/701; 505/704; 428/688; 428/930
[58] Field of Search .............. 420/501-505; 428/76, 688, 689, 930; 505/1, 701-704; 252/514

[56] References Cited

U.S. PATENT DOCUMENTS

| | | | |
|---|---|---|---|
| 3,845,365 | 10/1974 | Hicks | 252/514 |
| 5,017,553 | 5/1991 | Whitlon | 505/1 |
| 5,075,285 | 12/1991 | Flukiger | 420/503 |
| 5,104,849 | 4/1992 | Shiga | 428/426 |

OTHER PUBLICATIONS

Doss, Engineers Guide to High Tc Superconductivity, 1989 pp. 105-108.
Lynch "Handbook of Materials Science" Oct. 10, 1990 CRC Press.
Jin, "High Tc Superconductors" Appl. Phys. Lett. 51(3), Jul. 20, 1987.

Primary Examiner—Patrick J. Ryan
Assistant Examiner—Patrick R. Jewik
Attorney, Agent, or Firm—Juliusz Szereszewski

[57] ABSTRACT

An alloy having a low reactivity towards certain high temperature superconducting materials at temperatures up to about 10° C. lower than the melting point of the alloy. The alloy is a ternary silver-based alloy consisting, by weight, of 0.5-9% palladium, 20-40% gold, balance silver. Using the alloy and a superconducting material of the type R-Ba-Cu-O, where R is yttrium or a rare earth element, composite conductors can be formed at temperatures equal or higher than the temperature of peritectic decomposition of the superconductor. The alloy may also be used as a buffer layer or cladding material on substrates having unacceptably high reactivity towards the superconducting material.

7 Claims, 1 Drawing Sheet

10μm

ALLOY FOR HTSC COMPOSITE CONDUCTORS MADE OF AU-AG-PD

FIELD OF THE INVENTION

This invention relates to an alloy for composite conductors comprising a metallic part and a high-temperature superconductor (HTSC) and more particularly, to an alloy having a low reactivity towards certain HTSC's and therefore suitable for high-temperature processing with these materials.

BACKGROUND OF THE INVENTION

The use of high-temperature superconductors (HTSC) in the electrical engineering encounters problems where the superconducting material must be present in the form of a wire or cable. The best HTSC's known to date are ceramic materials (a mixture of certain oxides) which are very brittle materials and do not lend themselves easily to a change of shape once formed. Therefore, the HTSC materials must be preformed into the desired shape and mechanically strengthened with a metallic part: a sheath, an envelope or capsule, a backing tape, a metallic core, etc. Furthermore, HTSC-metal composite wires or tapes are required for most superconducting applications. This composite design serves many important functions. Indeed, the metallic phase allows dissipation of local heat that could be induced by the motion of flux lines in alternative magnetic fields. The metallic phase gives the advantage of providing an alternative current route, although of a relatively high resistance, in case where the superconducting material exhibits a local loss of superconductivity (so-called normalization) which could lead to dramatic heating and a destruction of these composite conductors. Minimization of AC losses, reduction of mechanical stresses and protection against environment by the metal cladding are also important considerations.

These are basically two methods of forming superconducting materials: sintering and directional crystallization in the molten state. The first bulk HTSC's were synthesized by solid state reaction and sintering. Their superconducting properties and especially their critical current density (Jc) were quite low and very sensitive to small applied fields. This behaviour is attributed to the existence of weak links between superconducting grains. Moreover, these HTSC are anisotropic materials in which superconducting currents preferentially flow along the a-b planes. In sintered HTSC, low Jc are also attributed to misorientation of these a-b planes. Extensive efforts have been made to improve Jc and better results have been obtained using melting processes during which directional crystallization of the superconducting phase takes place; this is called texturing or melt-texturing. The improvement in Jc is believed to be due to grain alignment and better connectivity of the superconducting phase. Sintering is usually carried out at relatively low temperature and involves solid state diffusion while directional crystallization must be carried out at higher temperatures in the molten state or partially molten state.

Amongst the three families of HTSC known today, this invention relates particularly to the R-Ba-Cu-O family where R stands for Y or a rare earth element. These R-Ba-Cu-O superconductors are complex materials that undergo a peritectic reaction on heating, that is to say, instead of forming simply a liquid upon melting, they form liquid and a new solid. For instance, in the case of the $YBa_2Cu_3O_x$ (Y-123) superconductors, this peritectic decomposition may be expressed by the equation $$YBa_2Cu_3O_x \rightarrow Y_2BaCuO_5 + liquid \tag{1}$$

This liquid is a Ba-Cu-rich solution and its exact composition depends on the temperature. In ambient air, this peritectic decomposition occurs at 1000° C. The typical sintering temperatures are around 930°-950° C. while the temperature of directional crystallization must be higher than 1000° C. However, this peritectic temperature also depends on the type of atmosphere in which the thermal treatment is carried out. For example, for the same $YBa_2Cu_3O_x$ superconductor, the temperature at which the peritectic decomposition occurs increases to 1010°-1015° C. in pure oxygen. Then, the exact composition of the liquid and its relative amount depend both on the temperature and the atmosphere.

This liquid phase formed during decomposition of the $YBa_2Cu_3O_x$ superconductor is extremely corrosive and reactive with a broad range of other materials, including metals (even noble metals), alloys and ceramics. Such reactivity does not come into play when sintering is used to form superconducting materials and combine them with a metallic envelope/backing tape since the temperatures used do not exceed the peritectic temperature of the superconducting material. An example of the prior art in this regard is European Patent Application No. 281 444 filed Feb. 05, 1988. A metal tube, the metal selected from a broad range of noble and other metals, is filled with ceramic powder selected to yield a superconducting ceramic, and then the tube is deformed so as to reduce its cross-section and subjected to a sintering heat treatment in the range from 700° to 1000° C.

Because of the high reactivity of the HTSC ceramics at or above their peritectic decomposition, many efforts have been directed at selecting a noble metal or an alloy of noble metals suitable for the processing of ceramic superconductors where the relatively high temperatures, above the peritectic temperature, are involved. M. Okada et al., "Texture Formation and Improvement of Grain Boundary Weak Links in Tape Shaped Wire Prepared by the Unidirectional Solidification Technique" (Mat. Res. Soc. Symp. Proc. Vol. 169, 1990, pp. 1283-1286) describe the performance of Au-sheathed Y-Ba-Cu-O superconducting tapes fabricated by drawing—rolling and subsequent unidirectional solidification. They did not mention any serious reaction problem between gold and the superconductor but this metal is very expensive and other authors showed that contamination or reaction problems occurred using gold as a metallic envelope (J. L. Porter et al., see below, and J. R. Verkouteren, SEM Analysis of Interactions between Pt, Au and AgPd Capsules and Barium-Yttrium-Copper Superconductors, Materials Letters, Vol. 8, No. 1.2, 1989, pp. 59-63).

J. L. Porter et al, "Reactivity of Ceramic Superconductors with Palladium Alloys" (J. Am. Ceram. Soc., 73 (6) 1990, pp. 1760-62) have tested palladium alloys for suitability as a non-reactive material for the processing of ceramic superconductors. The least reactive was found to be 70% Pd-30% Ag for $YBa_2Cu_3O_x$ HTSC's. However, a gap formed between the metallic foil and the superconductor after heat treatment at 1100° C. Clearly, such a gap indicated that there was no good contact at the interface which is not acceptable from the viewpoint of electrical conductivity.

Silver alone cannot be used with R-Ba-Cu-O type HTSC (where R stands for Y or a rare earth element) for melt processing because its melting point, around 960° C., is lower than the usual melt processing temperatures, above 1000° C.

Binary silver alloys (Ag-Au and Ag-Pd) were found to react with the superconductor or the liquid formed during melt processing at high temperatures.

SUMMARY OF THE INVENTION

It is therefore the object of the present invention to overcome the above drawbacks and to provide a metallic material for producing a composite high temperature superconductor. The present authors have researched a variety of noble metals and their alloys for suitability as a conductive layer which can be integral or co-extensive with a superconductive element.

It has been found that ternary silver alloys comprising by weight: 20–40% gold (Au) and 0.5–9% palladium (Pd), balance silver (Ag) have unexpectedly low reactivity with HTSC materials even at temperatures above the peritectic decomposition of the R-Ba-Cu-O superconductor, therefore are useful for the purposes described above and particularly for melt-processing of superconducting materials.

Preferably, the composition of the alloy is 4–6% Pd, 33–37% Au, balance silver.

The ternary silver alloys of the present invention have been proven to be inert with the $RBa_2Cu_3O_x$ superconductors during melt-processing at temperatures above the peritectic decomposition. Different alloy compositions were first elaborated and tested in laboratory. Composite structures comprising a silver ternary alloy and different $RBa_2Cu_3O_x$ compounds were melt-textured in different furnaces and characterized in order to determine the compatibility of the metallic alloys with the superconducting materials. Possible contamination of the superconducting phase was assessed by measuring the critical transition temperature ($T_c$) using resistivity and/or susceptibility techniques. The first technique gives an idea of the continuity of the superconducting phase while the latter technique, being very sensitive to any contamination, indicates the purity of the superconducting phase (revealed by a shift in the critical transition temperature $T_c$). Metallographic characterization was also used to evaluate the cleanliness of the metal- superconductor interfaces and possible reactions of the alloys with the superconductor.

The superconductive materials which are suitable for the purpose of the invention in combination with the above-defined alloys are the high temperature ceramic superconductors and especially the so-called R-Ba-Cu-O family (where R stands for Y or a rare earth element). In general, the alloys of the invention are applicable to superconductive R-Ba-Cu-O materials having the stoichiometric compositions $RBa_2Cu_3O_x$. Two variants of these HTSC's can also be used: $R_2Ba_4Cu_7O_{15-x}$ and $RBa_2Cu_4O_8$. These superconductive R-Ba-Cu-O materials can contain an excess of ceramic compounds such as CuO, $R_2BaCuO_5$, $BaCuO_2$, $BaCu_2O_2$, etc.

The alloys should be processed with the above-defined HTSC materials up to approximately 10 deg. C. below the respective melting point of the alloy selected. It will be understood that the melting points of these alloys vary with the changes of their composition. The changes are not substantial—generally within a few degress C. Also, the melting point varies depending on the atmosphere surrounding the alloy.

By way of example, the melting point of one of the alloys used to validate the invention, consisting of 60% Ag, 35% Au and 5% Pd (as in Example 6) is 1028° C. in air and 1031° C. in argon. It can be seen that these temperatures are approximately 30° C. higher than the temperature of peritectic decomposition of the HTSC's in question.

In the composition range of the alloys of the invention, the measure of "low reactivity" of the alloys towards the selected superconducting materials in the peritectic temperatures of the latter is the absence of contamination of the superconducting phase when analysed by means of the alternative current (AC) susceptibility method.

BRIEF DESCRIPTION OF THE DRAWINGS

In the drawings which illustrate typical microstructures obtained after partial melt processing of composite superconductors.

DETAILED DESCRIPTION OF THE INVENTION

In a preferred embodiment of the present invention, the ternary silver alloy, prepared according to conventional metallurgical processes, is used in different shapes and sizes and serves as a mechanical support for the shaping, the handling, the heat treatments including melt-processing of the ceramic superconducting materials in order to fabricate a composite high temperature superconductor.

The silver alloy may be shaped in a tube in which superconducting powder material may be poured in or deposited on the inner or outer surface of such said tube, or shaped in ribbons or strips or rods on which the superconducting material may be deposited using various techniques (for example: painting technique, plasma spraying, chemical vapor deposition, etc.). The silver alloy may also be used as a buffer layer or cladding material onto a different metallic or ceramic material for the same purposes as mentioned above (for example: silver alloy onto nickel or iron or steel or copper or yttria-stabilized zirconia (YSZ) or $Y_2BaCuO_5$ or magnesia (MgO), etc.).

As mentioned above, any of the known ceramic high-temperature superconductors (HTSC) of the so-called R-Ba-Cu-O family, where R stands for Y or a rare earth element, may be used with the silver alloys. For example, $RBa_2Cu_3O_x$, $R_2Ba_4Cu_7O_{15-x}$ and $RBa_2Cu_4O_8$.

Other metallic or ceramic materials can be added to improve the electrotechnical properties. These materials can be mixed with the basic superconductor in a powder form before heating. For example, Pt, $BaSnO_3$, $Y_2BaCuO_5$ and other compounds can be added to create pinning sites of $Nb_2O_5$, $ZrO_2$, $Sb_2O_3$ and other compounds can be added to facilitate oxygenation of these superconductors.

The following non-limiting examples further illustrate the invention.

EXAMPLE 1

Commercial $YBa_2Cu_3O_{7-x}$ powders were pressed in parallelepiped shapes ($25 \times 6 \times 1$ mm) and placed onto a metallic strip having the composition 62.7% Ag-34.0% Au-3.3% Pd (wt %). This composite was placed in a tube furnace at 995° C. for 45 min, cooled to 940° C. in 6 hours and then slowly cooled to 400° C. in 45 hours. The composite superconductor showed the characteristic resistive transition with an onset critical temperature of 92K. No reaction or contamination was observed in the superconducting phase as measured by X-ray dispersive spectroscopy analysis.

EXAMPLE 2

Figure 2:
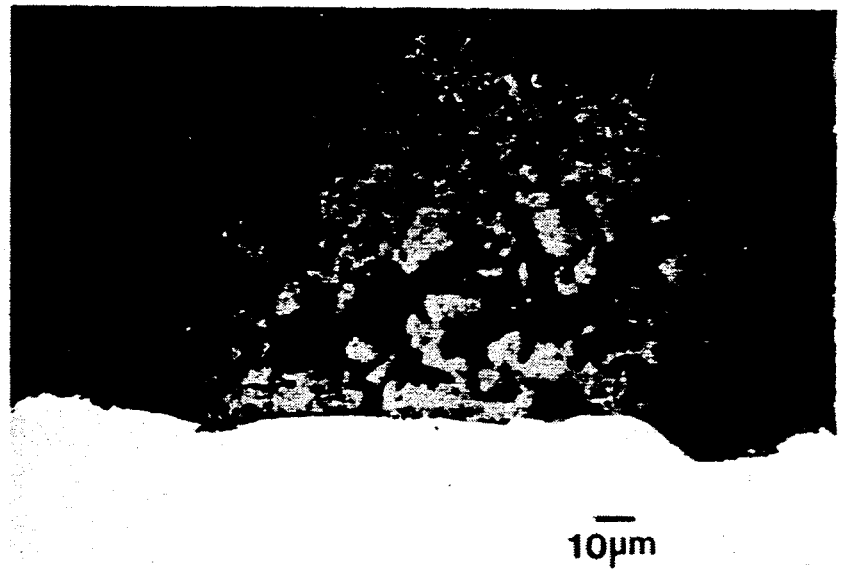
FIG. 2 is a micrograph (magnification 500×) showing a thick $YBa_2Cu_3O_{7-x}$ superconducting layer on a ternary silver alloy layer having the composition of, by weight, 66.5% Ag-24.4% Au-9.1% Pd (Example 2).

Commercial $YBa_2Cu_3O_{7-x}$ powders were pressed in parallelepiped shapes ($25 \times 6 \times 1$ mm) and placed onto a metallic strip having the composition 66.5% Ag-24.4% Au-9.1% Pd (wt %). This composite was placed in a tube furnace at 1030° C. for 30 min, rapidly cooled to 1010° C., cooled to 930° C. in 24 hours and then slowly cooled to 400° C. in 40 hours. The composite superconductor showed the characteristic resistive transition with an onset critical temperature of 92K. However, reaction between the superconducting phase and the metallic strips was observed. $BaCuO_2$ and CuO phase forming the liquid phase upon the peritectic decomposition of the $YBa_2Cu_3O_{7-x}$ phase at high temperature reacted with Pd (see FIG. 2—pale grey areas are BaCuO-CuO phases reacted with palladium).

Note that these reactions at the interface are not necessarily detrimental to the superconducting phase or to the integrity of the composite structure. Indeed, as long as the formation of the superconducting phase is not inhibited, the phase is continuous and not contaminated and the resistivity at the interface is not too high, these limited reactions are not detrimental. However, they indicate that the upper limit of Pd concentration in the ternary silver alloy is reached.

EXAMPLE 3

Commercial $YBa_2Cu_3O_{7-x}$, $Y_2BaCuO_5$ and Ag fine powders were mixed with a solvent and painted onto a metallic strip having the composition 59.7% Ag-35.3% Au-5% Pd (wt %) to form a coating approximately 50 μm thick. This composite tape was placed in a tube furnace at 1015° C. for 30 min, slowly cooled to 900° C. in 44 hours and then cooled to 500° C. in 15 hours. This tape was annealed in oxygen at 525° C. for 10 hours and slowly cooled to 425° C. in 80 hours in order to restore the superconducting properties. The superconducting tape showed the characteristic resistive transition with an onset critical temperature of 92K. No reaction or contamination was observed in the superconducting phase.

EXAMPLE 4

Commercial $YBa_2Cu_3O_{7-x}$, $Y_2BaCuO_5$ and Ag fine powders were mixed in the following respective weight proportions: 73%, 18% and 9%. They were cold pressed in parallelepiped shapes ($25 \times 6 \times 1$ mm) and placed between two metallic strips having the composition 64.5% Ag-28.6% Au-6.9% Pd (wt %). They were melt-processed and oxygenated according to the heat treatments described in example 3. The composite superconductor showed the characteristic magnetic exclusion with an onset critical transition temperature of 92K. No reaction was observed in the superconducting composite.

EXAMPLE 5

Commercial $YBa_2Cu_3O_{7-x}$, $Y_2BaCuO_5$ and Ag fine powders were mixed with a solvent and painted onto a metallic strip having the composition 59.3% Ag-34% Au-6.7% Pd (wt %) to form a coating approximately 50 μm thick. This tape was melt-processed and oxygenated according to the heat treatments described in example 3. The superconducting tape showed the characteristic resistive transition with an onset critical temperature of 92K. No reaction or contamination was observed in the superconducting phase.

EXAMPLE 6

Figure 1:
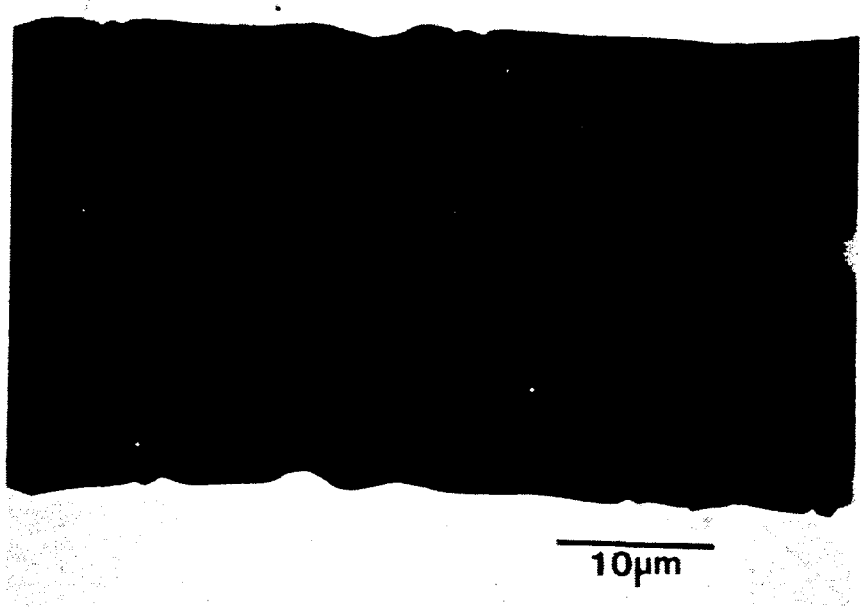
FIG. 1 is a micrograph (magnification 2000×) showing a thin $YBa_2Cu_3O_{7-x}$ superconducting layer between two ternary silver alloy layers having the nominal composition of, by weight, 60% Ag-35% Au-5% Pd (Example 6), where no contamination or reaction occurred during partial melt processing.

Commercial $YBa_2Cu_3O_{7-x}$, $Y_2BaCuO_5$, $Ba_3Cu_5O_8$ and Ag fine powders were mixed with a solvent and painted onto metallic strips which were piled to form a double sandwich. The thin and the thick superconducting layer confined between these metallic strips were approximately 15 μm and 30 μm in thickness respectively. The metallic strips had the nominal composition 60% Ag-35% Au-5% Pd (wt %) and were elaborated according to conventional metallurgical processes. This double sandwich was placed in a horizontal tube furnace at 1015° C. for 10 min and then pulled at 2.1 mm/h through a predetermined thermal gradient which was created in another zone in the furnace. This double sandwich was annealed in oxygen at 525° C. for 10 hours and slowly cooled to 425° C. in 80 hours in order to restore the superconducting properties. The superconducting double sandwich showed the characteristic resistive transition with an onset critical temperature of 92K. No reaction or contamination was observed in the superconducting layers (see FIG. 1).

EXAMPLE 7

Commercial $YBa_2Cu_3O_{7-x}$, $Y_2BaCuO_5$ and $Ag_2O$ fine powders were mixed with a solvent and painted onto both sides of a metallic strip having the nominal composition 60% Ag-35% Au-5% Pd (wt %) and cold rolled to form coatings approximately 60 μm thick. This laminated tape was melt-processed in a vertical tube furnace having a narrow hot zone set at 1010° C. creating a controllable thermal gradient. The tape was pulled at 2.5 mm/h through the thermal gradient and then transferred in a horizontal tube furnace to reoxygenate the superconducting phase according to the heat treatment described in example 6. The laminated tape showed the characteristic magnetic exclusion with an onset critical transition temperature of 92K. No reaction was observed at the interfaces or in the superconductor.

The above examples and the micrographs support the finding of the unexpectedly advantageous properties of the ternary alloys of the invention as defined in the appended claims.

We claim:

1. A composite conductor comprising a superconducting element of the formula $RBa_2Cu_3O_{7-x}$, where R is selected from the group consisting of Y, La, Nd, Sm, Eu, Gd, Dy, Ho, Er, Tm, Yb and Lu and a metallic element coextensive with and in virtually continuous electrical contact with said superconducting element, said metallic element being of an alloy consisting of, by weight, 20–40% gold, 0.5–9% palladium, the balance being silver.

2. The composite conductor of claim 1 wherein R is yttrium.

3. The composite conductor of claim 1 wherein said alloy is inert towards said superconducting element in a temperature ranging from 700° C. up to 10° C. below the melting point of the alloy.

4. The composite conductor of claim 1 wherein said alloy consists of, by weight, 33–37% gold, 4–6% palladium, the balance being silver.

5. The composite conductor of claim 1 wherein said metallic element constitutes a core of said composite conductor.

6. The composite conductor of claim 1 wherein said metallic element constitutes a cladding of said composite conductor.

7. The composite conductor of claim 1 wherein said metallic element constitutes a backing strip of said composite conductor.

* * * * *